(12) United States Patent
Narita et al.

(10) Patent No.: US 8,750,449 B2
(45) Date of Patent: Jun. 10, 2014

(54) STEEL CONCRETE STRUCTURE FOR REACTOR CONTAINMENT FACILITY

(75) Inventors: Shintaro Narita, Hitachi (JP); Masaaki Osaka, Hitachi (JP)

(73) Assignee: Hitachi-GE Nuclear Energy, Ltd., Ibaraki (JP)

( * ) Notice: Subject to any disclaimer, the term of this patent is extended or adjusted under 35 U.S.C. 154(b) by 628 days.

(21) Appl. No.: 13/019,486

(22) Filed: Feb. 2, 2011

(65) Prior Publication Data

US 2011/0194665 A1 Aug. 11, 2011

(30) Foreign Application Priority Data

Feb. 5, 2010 (JP) ................................. 2010-024007

(51) Int. Cl.
*G21C 15/00* (2006.01)
(52) U.S. Cl.
USPC .......................................................... 376/283
(58) Field of Classification Search
USPC .......................................................... 376/283
See application file for complete search history.

(56) References Cited

U.S. PATENT DOCUMENTS

| 7,684,535 B2 | 3/2010 | Hirako |
| 2003/0024176 A1 | 2/2003 | Kanechika et al. |
| 2008/0037696 A1* | 2/2008 | Hirako ........................... 376/283 |

FOREIGN PATENT DOCUMENTS

| DE | 33 21 255 | 12/1894 |
| GB | 1 413 330 | 11/1975 |
| JP | 6-294887 | 10/1994 |
| JP | 09-041489 | 2/1997 |
| JP | 2002-371653 | 12/2002 |
| JP | 2003-84089 | 3/2003 |
| JP | 2006-9244 | 1/2006 |
| JP | 2006009244 A * | 1/2006 |
| JP | 2006-78240 | 3/2006 |
| JP | 2007-204953 | 8/2007 |
| JP | 2008-249329 | 10/2008 |
| JP | 2008-275368 | 11/2008 |
| JP | 2009-68853 | 4/2009 |
| JP | 2009068853 A * | 4/2009 |

* cited by examiner

*Primary Examiner* — Timothy A Brainard
(74) *Attorney, Agent, or Firm* — Antonelli, Terry, Stout & Kraus, LLP.

(57) ABSTRACT

The present invention allows to inhibit antiplane deformation of steel plates due to the back pressure generated by water content of the concrete, and allows observation of the concrete during a service period.
In a steel concrete structure including an inner steel plate exposed to a high temperature environment, an outer steel plate, studs and concrete, a steam discharging pipe and a pipe opening are provided. The steam discharging pipe includes small openings. Water content inside the concrete evaporates in a state the temperature of the concrete reaches approximately 100° C., becomes steam, is concentrated in the vicinity of the rear surface of the steel plate, and is discharged to the outside of a containment vessel from the small openings through the steam discharging pipe.

8 Claims, 5 Drawing Sheets

STEEL CONCRETE STRUCTURE FOR REACTOR CONTAINMENT FACILITY

CLAIM OF PRIORITY

The present application claims priority from Japanese patent application serial No. 2010-024007 filed on Feb. 5, 2010, the content of which is hereby incorporated by reference into this application

BACKGROUND OF THE INVENTION

1. Field of the Invention

The present invention relates to a steel concrete structure and a reactor containment facility employing it.

2. Description of the Related Art

In an advanced boiling water reactor (ABWR), a reinforced concrete containment vessel (RCCV) is employed. The RCCV has such a structure that airtightness is retained by lining the inner surface with liners made of steel thereby leakage of radioactive material to the outside in an accident is prevented, and the load of an earthquake, pressure and the like presumed in the design is endured by reinforced concrete.

On the other hand, in recent years, reactor containment vessels employing a steel concrete structure with the strength and anti-leakage function of the same level of those of the RCCV have been proposed (refer to JP-A-2008-275368, JP-A-2008-249329, JP-A-2007-204953, and JP-A-H9-41489).

In the reinforced concrete structure, the work schedule tended to be prolonged by on-site works such as setting of reinforcing bars, a formwork for placing concrete, placing concrete and the like. On the other hand, in the steel concrete structure, concrete is filled inside a space sealed by steel plates. Also, the steel plates are fixed with the concrete through a plurality of studs arranged inside the steel plates to compositely bear a load, and therefore the reinforcing bars are not necessary. Furthermore, because the steel plates also function as the forms in placing concrete, the setting work of the reinforcing bars and the formwork on site are not required, and the construction period can be shortened.

SUMMARY OF THE INVENTION

As a problem of the steel concrete structure, deformation by thermal load when the inside of the containment vessel is abnormal can be cited. Due to the sharp thermal expansion of the steel plate, difference of the thermal elongation occurs against the concrete and the steel plate possibly buckles.

In addition, the moisture contained in the concrete may evaporate due to the heat when abnormality occurs, the steam inside the sealing steel plates may be concentrated between the rear surface of the heated steel plates and the concrete, the back pressure may be applied to the rear surface of the steel plates, and the steel plates may be bent beyond the initially installed flat plane to be antiplane-deformed causing drop of the buckling strength against the compressive stress.

Further, because the concrete was filled between the two steel plates, the condition of the concrete could not be confirmed visually after placing the concrete.

Furthermore, the purpose of arranging the studs in the steel plates is to secure the strength after placing the concrete, and the studs do not function as strengthening members before placing the concrete.

The present invention aims to discharge the steam generated by evaporation of the water content of the concrete to the outside of the steel plates and to prevent or inhibit the back pressure from applying to the steel plates, aims to visually confirm the condition of the surface of the concrete even during the service period, and aims to secure the strength of the steel plates even before placing the concrete.

The present invention is characterized in that, in a steel concrete structure for a reactor containment facility including a pair of steel plates composed of an inner steel plate exposed to a high temperature environment and an outer steel plate mutually opposingly arranged at an interval, a plurality of studs arranged on a surface of each steel plate in touch with concrete, and the concrete filled between the steel plates, a discharging opening for discharging steam is provided in the outer steel plate.

Also the steel concrete structure for a reactor containment facility is characterized in that a steam discharging pipe in touch with the rear surface of the inner steel plate and leading steam to outside the concrete through a pipe opening arranged in the outer steel plate is provided, and a gap is provided between the pipe opening and the steam discharging pipe.

Also the steel concrete structure for a reactor containment facility is characterized in that increased thickness parts are provided in the vicinity of the discharging opening and pipe opening.

Also the steel concrete structure for a reactor containment facility is characterized in that vertical partitions connecting the opposing inner steel plate and outer steel plate are provided, horizontal reinforcements for preventing buckling are provided in the inner steel plate and the outer steel plate, and openings for letting concrete flow in are provided in the horizontal reinforcements.

Also the steel concrete structure for a reactor containment facility is characterized in that the horizontal reinforcements are formed of horizontal partitions connecting the opposing inner steel plate and outer steel plate, and openings for letting concrete flow in are provided in the horizontal partitions.

Also, the present invention is characterized by including a reactor containment vessel having the steel concrete structure with the configuration described above.

Also, the present invention is characterized by including a reactor containment vessel internal structure employing the steel concrete structure with the configuration described above.

The steel concrete structure according to an aspect of the present invention allows to prevent or inhibit antiplane deformation of steel plates due to the back pressure by providing a discharging opening for discharging steam in the outer steel plate in the steel concrete structure for a reactor containment facility including a pair of steel plates composed of an inner steel plate exposed to a high temperature environment and an outer steel plate mutually opposingly arranged at an interval, a plurality of studs arranged on a surface of each steel plate in touch with concrete, and the concrete filled between the steel plates. Further, observation of the concrete during the service period is also allowed.

DETAILED DESCRIPTION OF THE PREFERRED EMBODIMENTS

Figure 1:
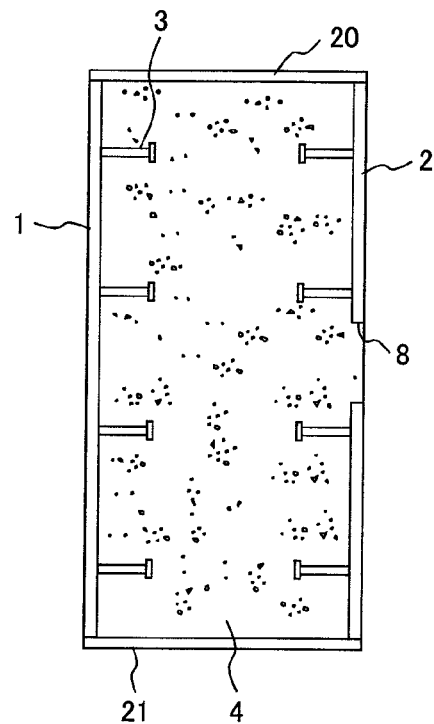
FIG. 1 is a vertical cross-sectional view of the steel concrete structure having the discharging opening in the outer steel plate.

Embodiments according to the present invention will be described below referring to the drawings.

Example 1

FIG. 1 is a vertical cross-sectional view showing a part of the steel concrete structure of Example 1. In the steel concrete structure for a containment vessel including an inner steel plate 1, an outer steel plate 2, an upper steel plate 20, a lower steel plate 21, studs 3 and concrete 4, a discharging opening 8 is provided. The discharging opening 8 has the function of discharging the steam inside the concrete, and allows observation of the condition of the surface of the concrete during the service period.

With the constitution, the steam inside the concrete is gradually discharged to the outside of the sealed steel concrete structure through the discharging opening 8, thus antiplane deformation of the inner steel plate 1 is avoided in particular.

Example 2

Figure 2:
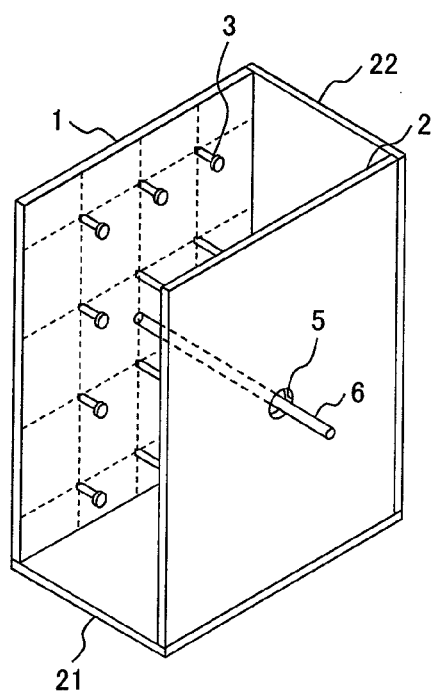
FIG. 2 is a perspective view of the steel concrete structure having the steam discharging pipe.
Figure 3:
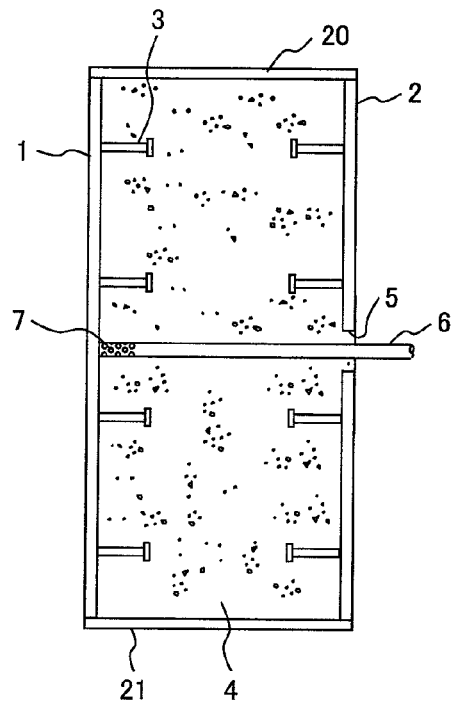
FIG. 3 is an explanatory drawing of the steel concrete structure having the steam discharging pipe.

FIG. 2 is a perspective view showing a part of the steel concrete structure. In order to explain the internal construction, the concrete is not shown in the figure. FIG. 3 is a vertical cross-sectional view of the steel concrete structure shown in FIG. 1. FIG. 2 and FIG. 3 show the steel concrete structure including the inner steel plate 1, the outer steel plate 2, the upper steel plate 20, the lower steel plate 21, a rear steel plate 22, the studs 3 and the concrete 4 provided with a steam discharging pipe 6 and a pipe opening 5 through which piping penetrates.

The steam discharging pipe 6 includes small openings 7 at its tip for letting the steam flow in. The steam discharging pipe 6 is joined to the inner steel plate in advance when the steel plate is to be installed, and the concrete is filled thereafter between the steel plates 1 and 2.

When the concrete is filled, in order to prevent the concrete from flowing into the steam discharging pipe 6 through the small openings 7, a small openings closing fixture formed of a small diameter pipe and the like that can be inserted to and pulled out from the steam discharging pipe 6 is used. When the temperature of the inner steel plate 1 rises, the water content inside the concrete evaporates in a state the temperature of the concrete reaches approximately 100° C., becomes steam, is concentrated in the vicinity of the rear surface of the steel plate 1, and is discharged to the outside of the containment vessel from the small openings 7 through the steam discharging pipe 6.

Example 3

Figure 4:
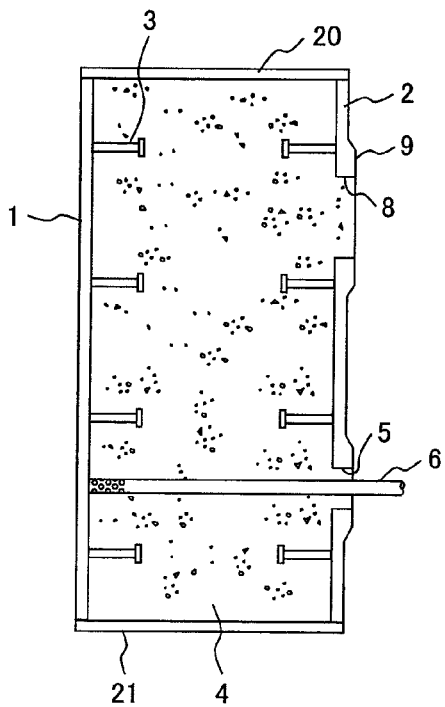
FIG. 4 is a vertical cross-sectional view of the steel concrete structure with increased plate thickness in the vicinity of the opening of the outer steel plate.

FIG. 4 is a vertical cross-sectional view of the steel concrete structure similar to that shown in FIG. 3, and shows that the increased thickness parts 9 are arranged around the pipe opening 5 and the discharging opening 8 and the steel plate thickness is increased. The increase of the plate thickness aims to reinforce the strength of the outer steel plate missed due to the openings.

Example 4

Figure 5:
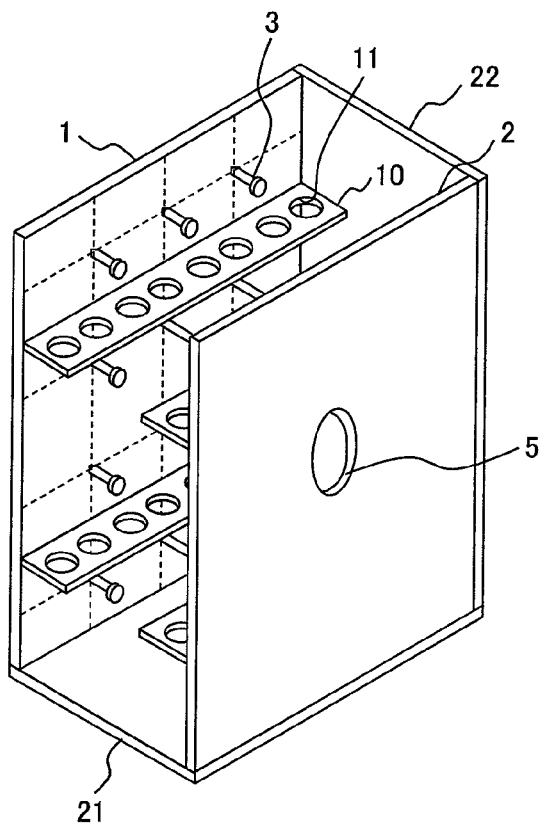
FIG. 5 is a perspective view of the steel concrete structure having the horizontal reinforcements.

FIG. 5 is a perspective view showing a part of the steel concrete structure having the horizontal reinforcements. The structure includes the steel plates 1 and 2, the studs 3, the concrete 4, the pipe opening 5, horizontal reinforcements 10, and vertical partitions 12. For simplicity, the concrete and the vertical partitions are not shown in the figure.

Figure 6:
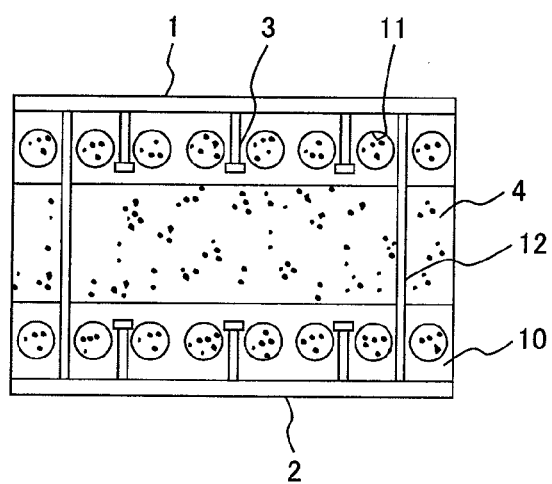
FIG. 6 is a plan view of the steel concrete structure having the horizontal reinforcements.

FIG. 6 is a transverse cross-sectional view of the steel concrete structure shown in FIG. 5, and the reinforcements 10 are provided with openings 11 to improve workability when the concrete is placed. The horizontal reinforcements 10 function as stiffener rings for the steel plates, and inhibit buckling of the steel plates before and after placing the concrete.

Example 5

Figure 7:
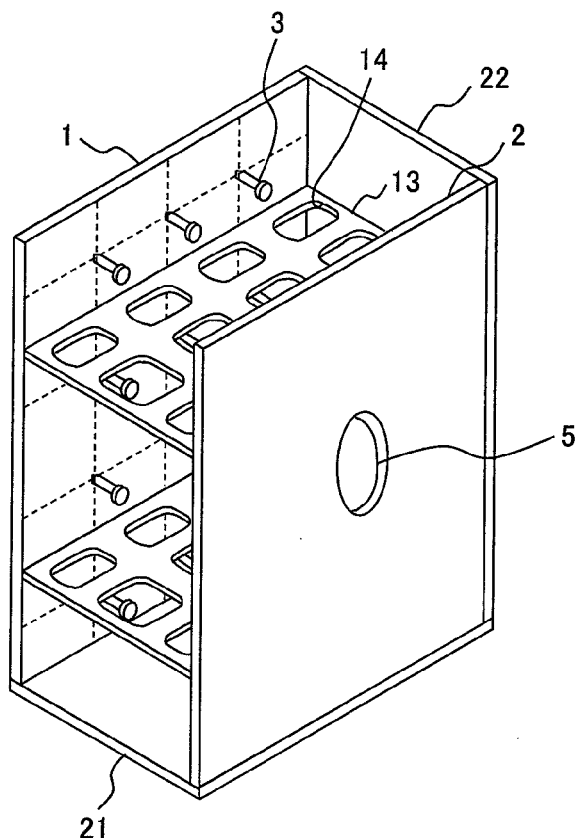
FIG. 7 is a perspective view of the steel concrete structure having the horizontal partitions.
Figure 8:
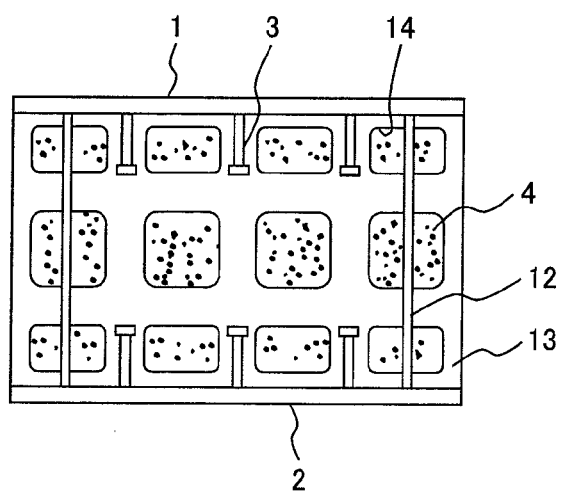
FIG. 8 is a plan view of the steel concrete structure having the horizontal partitions.

FIG. 7 is a perspective view showing a part of the steel concrete structure having the horizontal partitions. The structure includes the steel plates 1 and 2, the studs 3, the concrete 4, the pipe opening 5, the horizontal reinforcements 10, and the vertical partitions 12. For simplicity, the concrete and the vertical partitions are not shown in the figure. FIG. 8 is a plan view of the steel concrete structure shown in FIG. 7, and horizontal partitions 13 are provided with openings 14 to improve workability when the concrete is placed. The openings 11 and 14 can be of arbitrary shapes considering workability irrespective of the shape illustrated in the figure. The horizontal partitions 13 function as the stiffener rings for the steel plates, and inhibit buckling of the steel plates before and after placing the concrete.

Example 6

Figure 9:
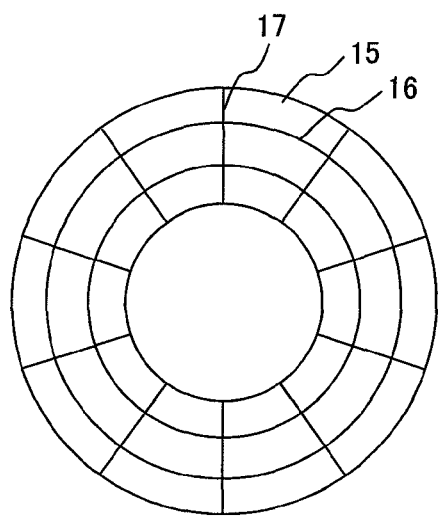
FIG. 9 is a schematic drawing of the steel concrete structure having the radial partitions assembled into a disk shape.
Figure 10:
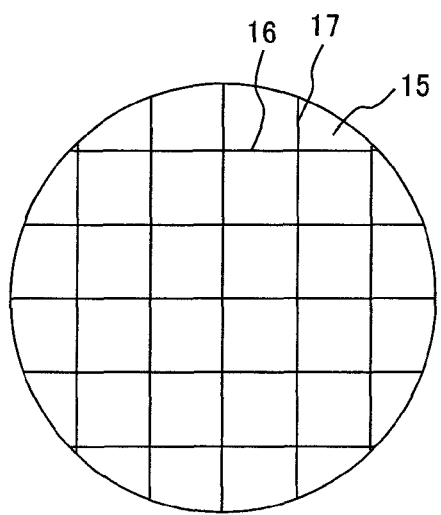
FIG. 10 is a schematic drawing of the steel concrete structure having the lattice-like partitions assembled into a disk shape.

The steel concrete structures of the Examples 1-5 are normally assembled into a cylindrical shape to be utilized as a reactor containment vessel, however they also may be of a vertical flat plane structure of a disk-shape as shown in FIG. 9 and FIG. 10. FIG. 9 shows a case in which the partitions are arranged radially and the concrete is placed inside, whereas FIG. 10 shows a case in which the partitions are arranged in a lattice-like formation and the concrete is placed inside. In this case, with respect to a pair of vertically arranged steel plates 15, partition 16 function as horizontal partitions arranged orthogonal thereto, whereas partition 17 function as vertical partitions. The concrete placed in the space formed by them is not shown in the figure.

These steel concrete structures can be used for a reactor containment vessel requiring pressure resistant and anti-leakage functions. Also, they can be used for a reactor containment vessel internal structure as well.

What is claimed is:

1. A steel concrete structure for a reactor containment facility comprising a pair of steel plates composed of an inner steel plate having a first thickness and exposed to a high temperature environment and an outer steel plate having a second thickness and mutually opposingly arranged at an interval, a plurality of studs arranged on a surface of each steel plate in touch with concrete, and the concrete filled between the steel plates,
   wherein a discharging opening for discharging steam is provided in the outer steel plate having the second thickness, and
   wherein the outer steel plate has a thickness greater than the second thickness arranged around the discharging opening in the outer steel plate.

2. The steel concrete structure for a reactor containment facility according to claim 1,
   wherein a steam discharging pipe in touch with the rear surface of the inner steel plate and leading steam to outside the concrete through a pipe opening arranged in the outer steel plate is provided,
   wherein a gap is provided between the pipe opening in the outer steel plate and the steam discharging pipe, and
   wherein the outer steel plate has a thickness greater than the second thickness arranged around the pipe opening in the outer steel plate.

3. The steel concrete structure for a reactor containment facility according to claim 2, wherein the steam discharging pipe is provided with plural small openings for enabling steam flow therethrough.

4. The steel concrete structure for a reactor containment facility according to claim 2, wherein the thickness of the outer steel plate greater than the second thickness of the outer steel plate is provided only in the vicinity of the discharging opening and the pipe opening in the outer steel plate.

5. The steel concrete structure for a reactor containment facility according to claim 1,
   wherein vertical partitions connecting the opposing inner steel plate and outer steel plate are provided,
   horizontal reinforcements for preventing buckling are provided in the inner steel plate and the outer steel plate, and
   openings for letting concrete flow in are provided in the horizontal reinforcements.

6. The steel concrete structure for a reactor containment facility according to claim 5 wherein,
   the horizontal reinforcements are formed of horizontal partitions connecting the opposing inner steel plate and outer steel plate, and
   openings for letting concrete flow in are provided in the horizontal partitions.

7. A reactor containment vessel having the steel concrete structure for a reactor containment facility according to claim 1.

8. A reactor containment facility internal structure employing the steel concrete structure for a reactor containment facility according to claim 1.

* * * * *